(12) United States Patent
Schieferdecker et al.

(10) Patent No.: US 6,294,787 B1
(45) Date of Patent: Sep. 25, 2001

(54) SENSOR SYSTEM AND MANUFACTURING PROCESS AS WELL AS SELF-TESTING PROCESS

(75) Inventors: Jörg Schieferdecker, Wiesbaden; Marion Simon, Marburg; Karlheinz Storck, Lorch; Manfred Rothley, Kraichtal; Erich Zabler, Stutensee; Rolf Jähne, Dresden, all of (DE)

(73) Assignees: Heimann Optoelectronics GmbH, Wiesbaden; Robert Bosch GmbH, Stuttgart, both of (DE)

( * ) Notice: Subject to any disclaimer, the term of this patent is extended or adjusted under 35 U.S.C. 154(b) by 0 days.

(21) Appl. No.: 09/133,802

(22) Filed: Aug. 13, 1998

(30) Foreign Application Priority Data

Aug. 14, 1997 (DE) .............................. 197 35 379

(51) Int. Cl.⁷ ...................................... G01J 5/20
(52) U.S. Cl. .............. 250/349; 250/339.09; 250/352
(58) Field of Search ................ 250/349, 338.1, 250/338.3, 338.4, 339.02, 339.03, 339.04, 339.09, 339.14, 341.5, 341.6, 252, 252.1

(56) References Cited

U.S. PATENT DOCUMENTS 3,742,231 * 6/1973 Spielberger ................. 250/338.1
3,801,949    4/1974 Larrabee .
5,193,911 * 3/1993 Nix et al. ......................... 374/121
5,753,916 * 5/1998 Ooisi et al. ....................... 250/345

FOREIGN PATENT DOCUMENTS

| 195 39 696 A1 | 10/1996 | (DE) . |
| 0 640 815 A1 | 3/1995 | (EP) . |
| 0 534 768 B1 | 5/1996 | (EP) . |
| WO 90/03560 | 4/1990 | (WO) . |
| WO 91/166607 | 10/1991 | (WO) . |

* cited by examiner

Primary Examiner—Constantine Hannaher
Assistant Examiner—Albert Gagliardi
(74) Attorney, Agent, or Firm—Weingarten, Schurgin, Gagnebin & Hayes LLP

(57) ABSTRACT

Presented is a sensor system for the detection of thermal radiation, with a substrate (15) and several sensor elements (10) on the substrate (15), in which case at least one self-test device (53) is provided in order to generate heat which can be used for the heating of one or more sensor elements (10). The sensor elements (10) can be heated according to a typical time pattern during the self-testing process. Also presented is an advantageous process for the manufacture of the sensor system as well as an advantageous configuration of the total system, including signal processing.

25 Claims, 5 Drawing Sheets

SENSOR SYSTEM AND MANUFACTURING PROCESS AS WELL AS SELF-TESTING PROCESS

FIELD AND BACKGROUND

The invention concerns a sensor system as well as a manufacturing process and a self-testing process for the same. The sensor system serves for the detection of thermal radiation. Various arrangements are known for the detection of thermal radiation, especially infrared radiation (IR-radiation). FIG.1 shows the principal construction schematically. Two (or more) sensor elements 10 are attached to a substrate 15. An image of the thermal or IR-radiation given off by a source of thermal radiation 19 is formed on the detection surface of the sensor elements 10, for example, by a lens 14. The radiation is imaged by this arrangement on one of several sensor elements 10, so that a resolution according to different spatial-angle zones is possible in proportion to the number of sensor elements 10.

Such systems have the disadvantage that thermal inductive disturbances or cross talk can result due to heat conducted between the individual sensor elements 10. This means that a sensor element 10, which is not illuminated by (optically imaged) infrared radiation, will deliver a signal nevertheless, because it receives heat from neighboring sensor elements 10 which are irradiated by thermal radiation. A sensor element can be thereby warmed, for example, by several tenths of a degree. This heat can spread to an unirradiated neighboring element and there lead likewise to an output signal. The contrast of the sensor system is thus diminished. Moreover, it is thus far not possible to check the functional capability of the sensor system (including all individual sensor elements 10) easily during operation.

The application of thermopiles to a carrier membrane which is a poor conductor of heat and is stretched over cavities etched in the carrier substrate is known from U.S. Pat. No. 3,801,949. The cavities serve for the thermal insulation of the sensor element 10 with regard to the substrate 15 and thus to increase the sensitivity of the sensor system. But cross talk is detected even with this design, so that the heat insulation of the individual sensor elements with respect to one another is not sufficient. Moreover, only a comparatively small part of the substrate surface is actually covered with sensor elements 10, because the etched cavities, formed from the back side of the substrate, do not have vertical walls, which necessitates wide spacing between the individual sensor elements attached to the substrate. The detection sensitivity thus becomes too low, and relatively small point sources can become images on places between the sensor elements, as a result of image formation by the lens, so that they are not detected, and the sensor system will thus work unreliably.

FIG. 2 shows arrangements, in section as well as in the top view which is not to scale, as they are known in the state of the art. In FIG. 2A, the sensor element 10 is positioned over the etched cavity 24, which has sloping walls. The sloping walls result due to the influence of the crystal orientation in the substrate 15 upon the known manufacturing process. The sensor elements 10 are thereby widely spaced from one another, so that the density with which the surface is filled is low and the detection reliability not satisfactory. FIG. 2B shows an embodiment where the etched cavities 25 have a rhomboid outline, with walls which are vertical in the direction of thickness. The rhomboid outline arises in the case of this embodiment likewise as a result of crystal orientation. FIG. 2C shows an embodiment, in which cavities 26 are formed by an etching process from the front side of the substrate. These cavities 26 also exhibit sloping walls 21, so that the mutual spacing of the sensor elements 10 themselves is relatively wide. FIG. 2D, finally, shows an embodiment, in which a gap 23 is formed between the sensor element 10 and substrate 15, by first applying a sacrificial layer and then removing it after formation of the sensor element 10. Due to the small distance, the thermal insulation of the sensor element relative to the substrate 15 is poor, so that the signal amplitude and thus the sensitivity of the sensor system is low. Procedures based upon sacrificial layers are described, for example, in DE 19,539,696 A1 or in EP 0,534,768 or in PCT/EP89/01082. Processes making use of anisotropic etching behavior are described in EP 0,640,815 A1 or PCT/AU91/00162. In the case of the anisotropic etching process, the achievable packing density is restricted by the crystalline structure. The sacrificial-layer process results in high packing densities and low cross-talk levels. But because the tub or cavity depth is technologically limited to only a few $\mu$m, the thermal insulation of the sensor elements 10 and thus the signal amplitude are on the whole unsatisfactory.

BRIEF SUMMARY

Presented is a sensor system for the detection of thermal radiation, with a substrate (15) and several sensor elements (10) on the substrate (15), in which case at least one self-test device (53) is provided in order to generate heat which can be used for the heating of one or more sensor elements (10). The sensor elements (10) can be heated according to a typical time pattern during the self-testing process. Also presented is an advantageous process for the manufacture of the sensor system as well as an advantageous configuration of the total system, including signal processing.

Sensor system for the detection of thermal radiation, further is used with a substrate, several sensor elements, each attached to the substrate and each of which generates an electrical signal in proportion to the thermal radiation striking it. A signal-processing device converts at least the electrical output signals of sensor elements lying parallel to one another into a serial signal and delivers this to an output.

For monitoring by the sensor system during the self-testing process, the anticipated characteristic signal is extracted from the output signal of the sensor system on the basis of the operation of the self-test device, in order to serve as a signal for monitoring.

The goal of the invention is to create a sensor system which operates reliably and permits high quality signal detection.

A further task of the invention is to produce a sensor system whose operation can be easily monitored, as well as testing procedure for the same.

A further task of the invention is to create a sensor system which is small in size and cheap to produce.

These objections are achieved with the features in the independent claims. Dependent claims focus upon preferred embodiments of the invention.

DESCRIPTION OF THE DRAWING

Individual embodiments of the invention are described below with reference to the drawings. In the drawing.

DETAILED DESCRIPTION

Features of the invention will now be discussed which can be provided individually or in combination.

Figure 1:
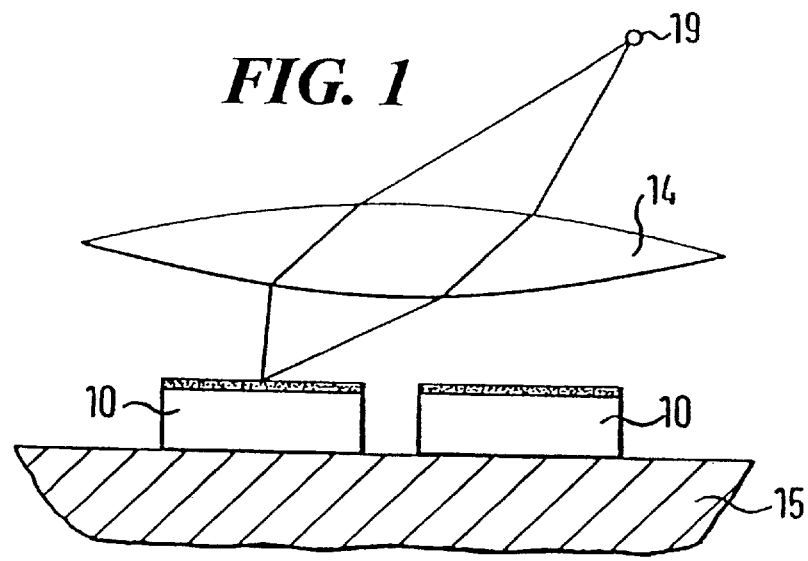
FIG. 1 shows the principal structure of the sensor system.
Figure 3A:
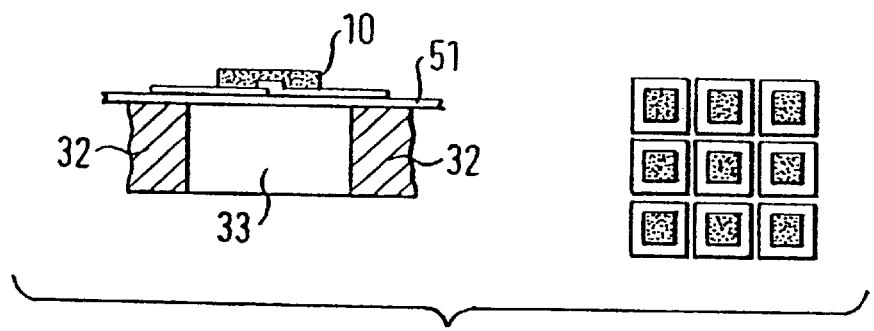

FIG. 3 shows embodiments, in which the invented sensor system comprises at least several sensor elements 10 and a substrate 15. The sensor system usually operates together with an imaging device 14. Such an imaging device can be a lens, a lens system, a suitable mirror device or the like, which forms an image of the incident thermal radiation on one of the sensor elements 10.

The sensor elements 10 are, preferably, thermoelectric detectors, for example, thermopile sensors, because are equally photosensitive and permit simple signal processing. The sensor elements 10 can also however be different thermal detectors, for example, pyroelectric detectors which deliver a signal only with changes in the incoming thermal radiation, or bolometers. Other sensors can also be used, which yield a signal according to the scale of the incident thermal radiation.

Figure 4:
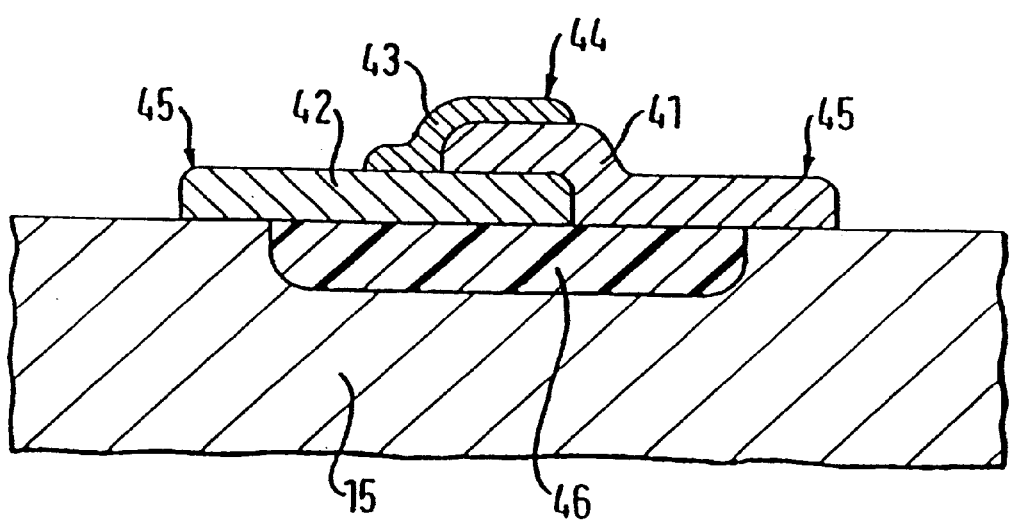

The structure of a thermopile-based sensor element is described in greater detail with reference to FIG. 4. In FIG. 4, 15 designates the substrate, 46 a thermal-insulation device, 41, 42 layers of different, suitable materials and 43 a layer for the absorption of heat. The arrangement has a "hot end" 44 and a "cold end" 45. The hot end 44 lies over the thermal-insulation device 46 and below the absorption layer 43. The hot end is thereby warmed by the incident infrared radiation. The cold end 45 has, in the version shown, a "left" and a "right" extension which respectively lie over the substrate 15 that serves as a heat sink. The arrangement described assures that the hot end 44 is heated by infrared radiation, supported by the absorptive layer 43 and the thermal-insulation device 46, whereas the cold end 45 or its two extensions retain essentially the temperature of the substrate 15 which serves as a heat sink. As a result of the temperature difference between hot end 44 and cold end 45, a voltage arises which can be measured at the two extensions of the cold end 45. The magnitude and polarity of the voltage thereby depend, among other things, upon the choice of the materials of layers 41 and 42 and the quality of the insulation between the hot and cold end. To enhance the effect, provision can be made to connect several of the devices shown in FIG. 4 in series. The extension of the cold end 45 of one unit would then be connected to the extension of the cold end 45 of the other unit. The respective signal voltages would be thereby added together, permitting a stronger effect to be obtained. In the sense of this report, units according to FIG. 4, which may be connected in series, form a single sensor element that delivers a single signal voltage. The sensor element thereby contains all the hot ends 44 and cold ends 45 of several units per FIG. 4, which may be connected in series. The actual detection surface of the sensor element will thereby correspond essentially to the surface covered by the absorption layer 43, as a significant heating takes place in this zone, generating the signal. The absorption layer 43 is therefore preferably formed in such a way that it lies on the substrate 15 just within base surface defined by the heat insulator 46. The contact point of the two layers 41 and 42 lies beneath the absorption layer 43.

Because the surface of the absorption layer 43 essentially defines the zone generating the signal, that zone occupied by the absorption layer 43 can also be designated as the sensor zone 43 of the sensor element 10. It should be noted in this regard that it is not absolutely necessary to provide a separate layer 43. Also conceivable is the creation of a zone acting like the absorption layer 43, perhaps by a suitable surface treatment of layers 41, 42 in the zone of their contact over the thermal-insulation device 46. The cold ends 45, unlike what is shown in FIG. 4, can also lie directly alongside one another on the substrate 15, in which case, the layers 41, 42 will then extend, approximately parallel, toward the thermal-insulation device 46 and beneath the absorption layer 43.

The sensor elements 10 are attached to a substrate or carrier 15. The substrate 15 is preferably silicon. The sensor elements 10 can be attached to the substrate in rows or as a two-dimensional field, or they can be attached along a strip or on surfaces which correspond to the image of the zones or areas to be monitored by the lens 14. For example, fifteen sensor elements 10 can be arranged on a 3×5 field. By means of suitable contacts (not shown in the figures), their respective output signals are passed along in such a way that they can be queried or evaluated separately for the individual sensor elements 10. Even much larger sensor fields are quite possible. According to need, even fields of, for example, 10×10 or 100×100 can be formed. These will then have a correspondingly finer local resolution.

The substrate 15 exhibits depressions 33, 35, 54 in the material beneath the respective sensor elements 10. A ridge of material 32 can be advantageously positioned respectively beneath the intervening space between neighboring sensor elements 10. The material depressions 33, 35, 54 serve as the thermal-insulation device 46 in FIG. 4.

In a general embodiment, a material depression 33, 35, 54 is present in each case only beneath one or more sensor elements 10 of a sensor system. In its preferred embodiment, a depression 33, 35, 54 is located beneath each sensor element 10.

Figure 5:
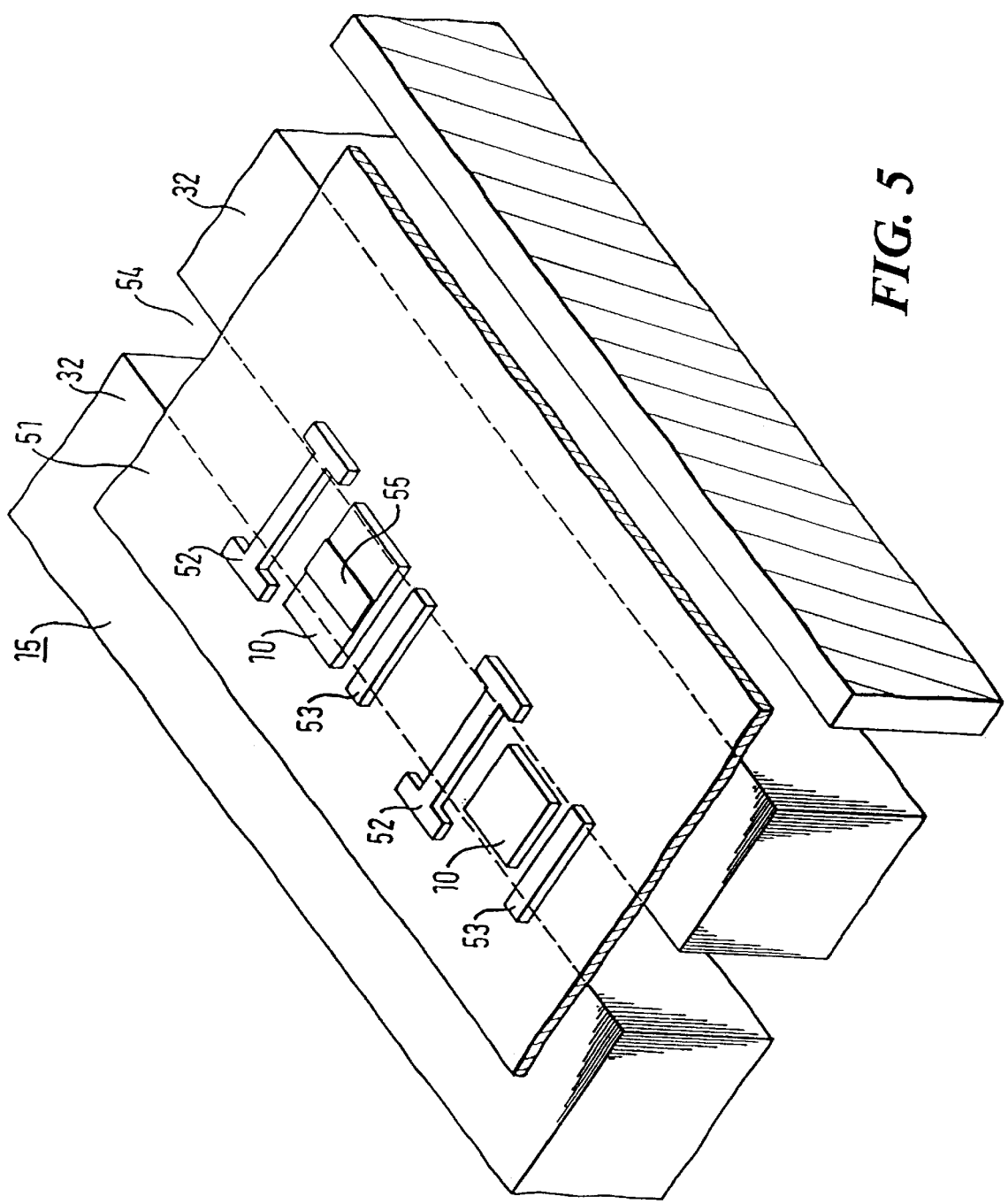
FIG. 5 shows several additional embodiments of the invention, in combination.

The material depressions 33, 34, 54—even within one sensor system—can also have different shapes or be produced by different methods of manufacture:

Numeral 33 (FIG. 3A) designates a hole which can be formed preferably from the back side of the substrate 15. The dimensions of the edges of the hole on the front side of the substrate are such that the sensor element 10 possibly lies, via its area and particularly its cold ends 45, on the edges of the hole. FIG. 5 shows yet another embodiment, below which a sensor element 10 can be attached to the substrate. This is explained later.

Figure 3B:
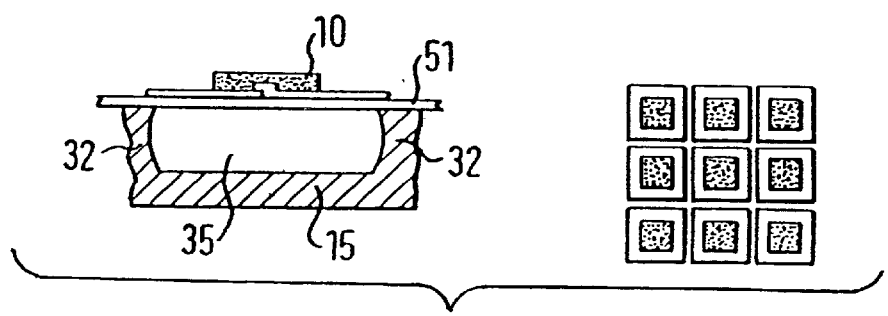
Figure 2A:
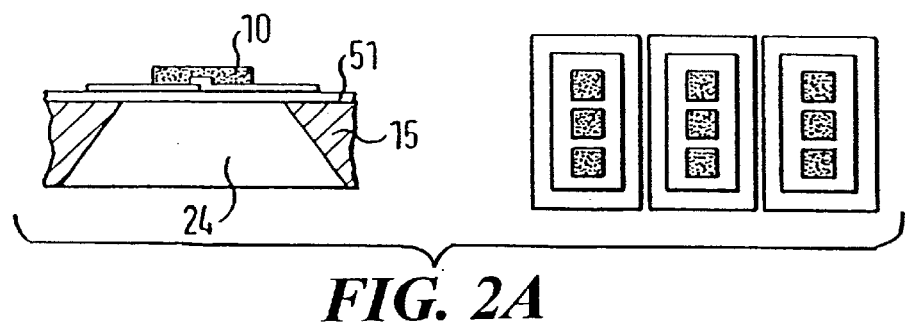
FIGS. 2A–D shows several sensor systems produced according to the known process, FIGS. 3A, B are embodiments of sensor systems per the invention, in cross-section and from the top, FIG. 4 are schematic views of a thermopile sensor element.
Figure 2B:
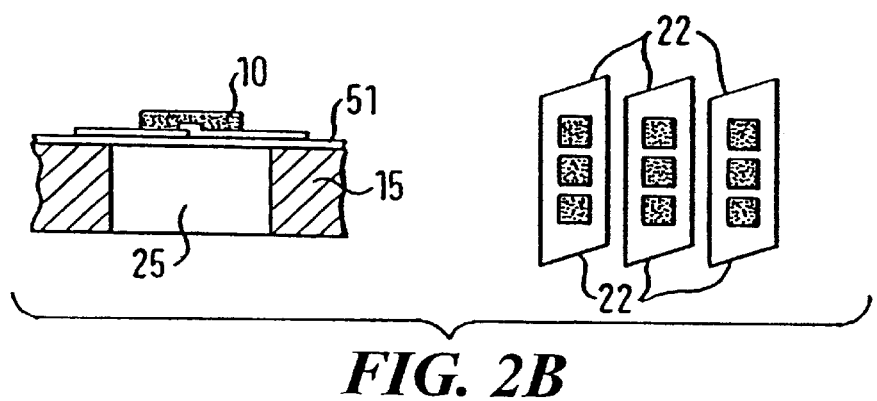
Figure 2C:
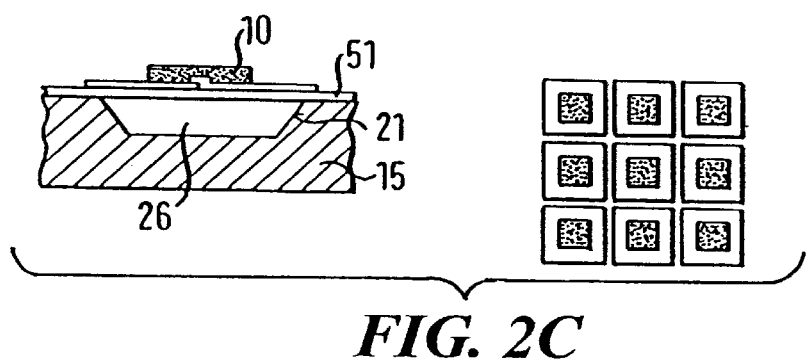
Figure 2D:
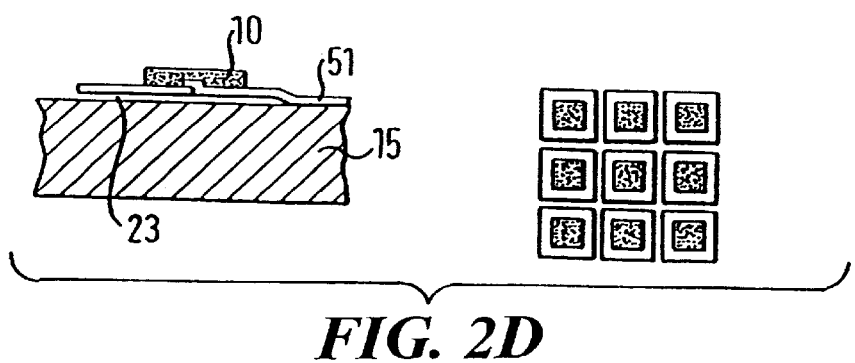

FIG. 3B shows an embodiment of the depression in the material, where a depression 35 is formed on the front side of the substrate, the dimensions of which are so arranged that the sensor element 10 is positioned on the edges of the depression 35 and can be attached to them. It is also here that the attachment to the substrate per FIG. 5 can take place.

Particularly advantageous methods for producing the depressions in the material 33, 35, 54 beneath the sensor elements are the following:

Reactive ion etching in bulk micro mechanics. The process is also called DRIE (Deep Reactive Ion Etching). In this case, a hole is preferably formed through the substrate from the back side of the same. This is a plasma-etching process, with which it is possible to produce straight walls and precisely dimensioned measurements. Comparatively thin, long holes can be formed. The individual holes therefore require little room on the substrate, permitting the resolution as well as the filling of the surface and thus the resolution to be increased due to the greater number of sensor elements per unit of sensor surface, or greater sensor surface per unit of substrate surface. It chould be noted in this context that the drawings in FIGS. 1 through 5 are not to scale. They represent the respective embodiments only qualitatively. A hole 33 per FIG. 3A can be produced by reactive ion etching. With this technique it is possible, for example, to create regularly spaced holes of any diameter, especially diameters between 50 and 200 μm, through a wafer with a thickness of 500 μm, which serves as a substrate 15. The hole will thus have a depth corresponding to the thickness of the wafer, so that the hot end will be well isolated and thus the sensitivity of the sensor improved. Due to the nearly vertical walls, only thin ridges 32 need to remain in place, so that a high packing density results. In the case of a preferred embodiment, 90 to 99% of the hole is generated by active ion etching. The hole is then generated to final depth (100%) by means of an isotropic or anisotropic etching process.

The production and further processing of porous silicon. The work proceeds in this case micromechanically, from the front side of the substrate. In a first step, porous silicon is created in those surfaces of the substrate 15, where the material depressions 33, 35, 54 are to be located later on. An electrochemical process is used for this purpose. The actual depressions in the material are then produced in such a way that the depressions 35 corresponding to FIG. 3B result. Preferably, the hollows 35 are first formed then by the removal of the porous silicon, if porous silicon was previously formed on the substrate 15 or the sensor element 10. The porous silicon is then etched away, starting from the surface. Depressions with a depth of more than 100 μm can be produced in this way. When depressions 35 are used instead of holes 33, the substrate and overall structure will exhibit greater mechanical stability after manufacture. This process has the advantage that it is independent of the wafer thickness and that a high packing density can be achieved, with good sensitivity.

The two procedures named above have the advantage that they are not influenced by the crystal orientation in the substrate. For this reason there are no edge conditions present which can have a negative influence upon packing density.

FIG. 5 shows several additional embodiments, in combination, with which, among other things, thermal cross talk can be prevented. The material depression provided in this case is an elongated trench 54 which can be formed using one of the methods named above, from either the front side or the back side of the substrate. Several trenches, each with several sensor elements can preferably be provided parallel to one another. The substrate 15 is coated with an insulating layer 51. The sensor elements 10 are attached to the insulating layer 51 in such a way that at least a part of their area lies over the trench 54. In particular, the sensor zones which are predefined by the absorption layer 43 lie over the trench 54. Reference numeral 55 shows an absorption layer corresponding to the absorption layer 43 in FIG. 4. Lying below the absorption layer 55 is the hot end of the sensor element 10, while the cold ends lie over the ridges 32 enclosing the trench 54. The forward sensor element 10 lies completely over the trench. These two options are also possible if the material depressions are not provided in the form of a trench 54, but according to the embodiments seen in FIG. 3.

Provided near the sensor element 10 is an insulating device 52. It consists of a material which is a good heat conductor, for example, a thin layer of metal. The insulating device serves as a heat sink, which dissipates the heat, which could spread via the insulating layer 51 to the neighboring sensor element, in other directions. It is preferably attached in such a way that it lies, on the one hand, over material recesses such as, for example, the trench 54 or holes 33, 35, and, on the other, over the substrate ridges 22. It preferably lies between neighboring sensor elements 10. Because silicon is a comparatively good conductor of heat, it is advantageous to conduct heat out of those zones of the insulating layer 51 not in communication with the substrate into those zones in direct communication with the substrate, so that the heat can then diffuse into the substrate and its ridges 32 and not reach the adjacent sensor element. The insulating device 52 can also be formed by substrate bridges which lie beneath the insulating layer 51 and span the trenches 54 or larger holes. Such substrate bridges likewise act as a heat sink for the heat spreading over the insulating layer 51, so that the heat is dissipated into the substrate 15, 32. The insulating device can also take the form of slots in the insulating layer 51, passing over the material depression, or that of a combination of bridges and slots. Such slots in the insulating layer 51 interrupt the flow of heat through the insulating layer to the neighboring sensor element 10. The heat will then spread in the insulating layer 51 in the direction in which it reaches those regions of the insulating layer 51 in communication with the substrate 15 or with its ridges 32, so that the heat is absorbed in these heat sinks.

The insulating layer is a layer which conducts heat less well than silicon and is not a good conductor of electricity. It serves, on the one hand, as thermal and electrical insulation and, on the other, for carrying the sensor elements 10 over the material depressions 23, 25, 44. It can consist, for example of silicon oxide, silicon carbide and/or silicon nitride and is usually thinner than 1 μm. It can be formed first and the material depressions 33, 35, 54 then produced later. In that case, the insulating layer, if the material depression is formed from the back side of the substrate, will act as an etching stop. If the material depression is formed from the front side of the substrate, the insulating layer 51 can then be punched through using a specially adapted etching procedure, for example, by RIE (Reactive Ion Etching).

Reference numeral 53 designates self-test devices which can be used for a self-testing function. These are heating elements in this case, which can charge the sensor elements 10 with heat, so that a check can be made whether the sensor elements 10 deliver a signal in the manner anticipated during this application. The self-test devices 53 can be heat-resistors which receive current through lines (not shown) and then, when current flows through them, heat up and then heat the sensor elements 10 by means of thermal radiation and/or conduction via substrate 15 and the optionally present insulating layer 51. One self-test device 53 can be provided per sensor element 10. The self-test devices 53 can also however be mounted between sensor elements 10 in such a way that they irradiate or heat two or more of the sensor elements. The self-test elements 53 can be arranged in such a way that they can be controlled individually or that they are controlled together. The self-test devices 53, preferably taking the form of heat resistors, can be straight strips made from a resistant material which extends preferably parallel to one edge of a sensor element 10, along the edge. If several self-test devices 53 are provided, these can, if individual control is not necessary, be connected together mutually parallel or in series.

In a preferred embodiment the material for the self-test device 53 can be so chosen that the self-test device also performs the function of an insulating device 52. The two devices will then no longer be separated, but provided combined into a single unit. The material is to be chosen in such a way that it heats up when the current flows, on the one hand, but has on the other a capacity to conduct heat better than that of the fluid (for example, air) adjacent to the insulating layer 51. Preferably, the heat-conducting capacity is better than that of the insulating layer 51. Conceivable materials are metallic or semiconductor resistive layers, for example, polysilicon, crystalline silicon, aluminum or gold. This embodiment can be accordingly configured in such a way that a sensor element 10 as well as a combined self-test/insulating device 52, 53 lie in each case alternately, over the trench 54. Because a self-test device 53 can apply heat to the two sensor elements 10 adjacent to the trench, an embodiment can also be configured so that every second device between sensor elements 10 will be a combined self-test/thermal-insulation device 52, 53 able to receive current via suitable contacts, while every other device (positioned in the respective second intervening space) is a pure heat-insulating device 52. Resulting thereby is a more cost effective and at the same time more compact sensor-system structure.

All the self-test devices 53 are heated during the self-testing process (thermal resistors), so that they can in turn heat or irradiate the sensor elements 10. A check is then made whether the respective sensor elements 10 are delivering a signal qualitatively and/or quantitatively expected. It is possible in this way to check the operation of individual or of all the sensor elements 10. A calibration of the sensor system is also possible. By comparing the output values delivered during the self test with the values expected, characteristic values of a sensor element can be obtained, and these can then be adapted as nominal values.

Because the masses of the elements involved are comparatively small, the self test can take place with comparatively short time constants. This offers advantages for certain application fields, for example, in motor-vehicle technology. In modern motor vehicles, the entire sensor system is checked when the vehicle is started. Thanks to short time constants, the invented self test can be completed within a short time, preferably less than 1 second, on starting the vehicle.

Because, in addition to those signals generated by the self-testing procedure, the sensor elements also "see" the infrared scenery likewise also present, it can be advantageous to guide the self-test devices 43 in a set temporal pattern, in order to distinguish the self-testing signal from the remaining scenery. This temporal pattern would then essentially reappear in the output signal of the tested sensor elements 10. The temporal pattern can, for example, be a sequence of two or more pulses or a signal changing over time. Because the time constants are short due to the small mass, time constants shorter than 50 ms, preferably less than 5 ms, are possible. They are thus more rapid than changes arising due to detected objects. They can therefore be distinguished from the infrared scenery lying parallel to the self test, so that, even during the self test, monitoring can be continued by calculating the test signal from the sum signal (self-test signal plus infrared scenery). Moreover, the cross section and resistance of the individual heating elements of the self-test device 53 can vary. This results in different heating outputs and varying heating levels or self-test signals for the respective sensor elements assigned to the self-test elements 53. The self-test signal can also be distinguished thereby from the infrared scenery additionally present during the conventional operation of the sensor system. The above process also makes it possible to distinguish the self-test signal from disturbances.

The guidance of the self-test devices 53 and the subsequent checking of the output signals of the sensor elements 10 described above takes place preferably by means of a controller (not shown).

The described sensor elements 10 generally produce a signal which is equal in magnitude to the intensity of the incident thermal radiation, that is to say, an analog signal. Due to the fact that several sensor elements 10 are provided, several analog signals are thus transmitted or processed. This can take place by multiplexing the analog values in the immediate vicinity of the sensor elements 10 and delivering the serial signal produced over a data line. The number of the required signal-output line is considerably reduced by this measure, in the extreme case, to a single one.

Figure 6:
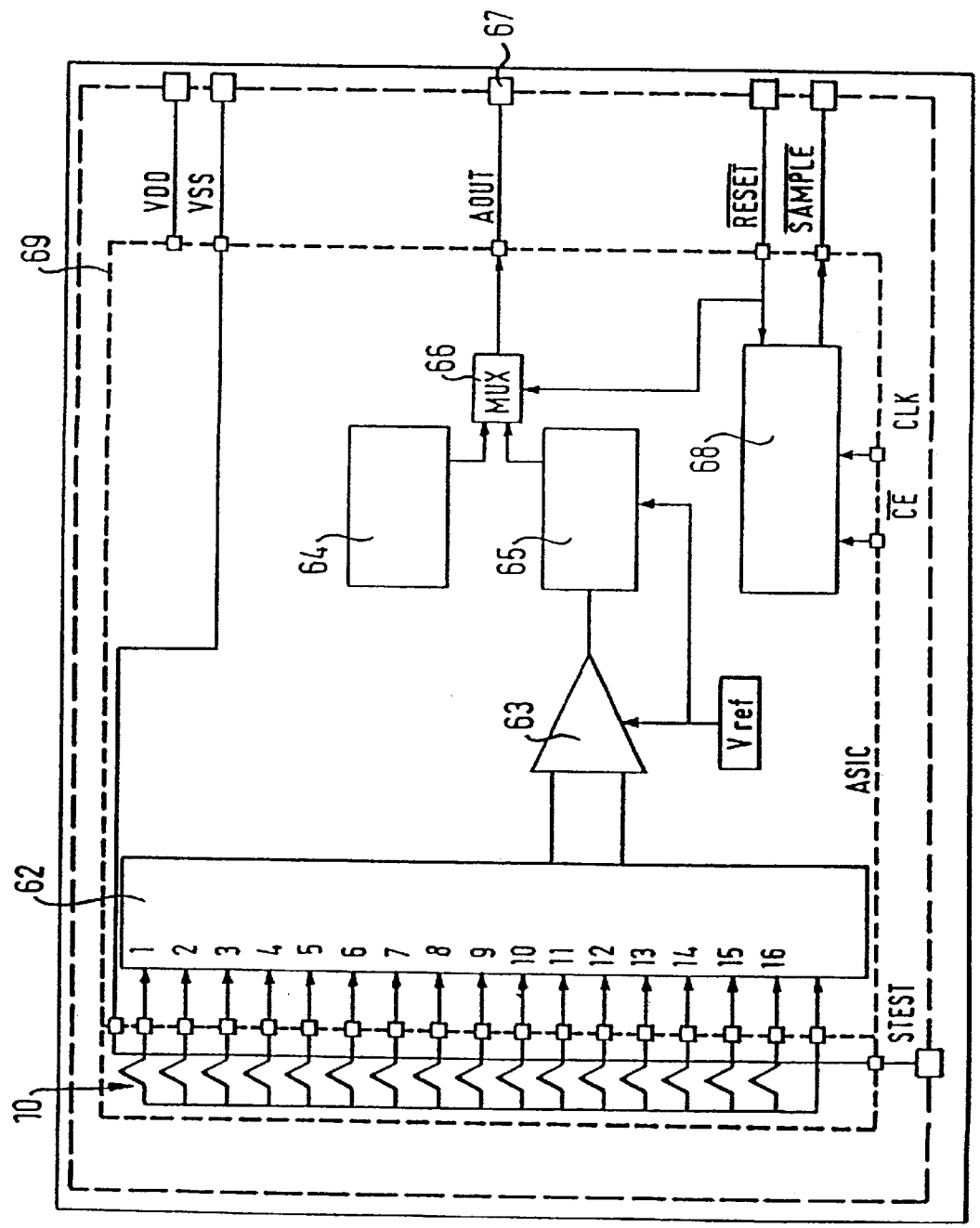
FIG. 6 shows the circuit diagram of a further embodiment of the invention.

FIG. 6 shows an example of a relevant circuit diagram. Seen as a circuit diagram below 10 are several sensor elements which respectively deliver, each individually, an input signal (1 through 16) to the analog multiplexer 62. Each signal selected is amplified in the amplifier 63. The signal output by the amplifier could already be output in this manner. An analog sample-and-hold device 65 can be additionally provided, which receives the analog signal from the amplifier 63. Moreover, a temperature sensor 64 can be provided, which generates an analog signal corresponding to the absolute temperature of the sensor system. By means of an additional multiplexer 66, the output signals of the temperature sensor 64 and the sample-and-hold device 65 are combined, so that a single analog signal appears at the data output 67, which shows, serially over time, the output signals of the individual sensor elements 10 as well as the optionally present temperature sensor 64. Such an embodiment variant has only a single data output 67. In addition, a few additional connections are required, preferably 1 or 2 for control functions, as well as for the power supply. Reference numeral 69 thereby designates the symbolically represented boundary of the sensor system. All the components shown are mounted within an area encompassing a few millimeters. The entire system can, for example, be made smaller than 100 mm$^2$. FIG. 6 shows an embodiment, in which no analog-digital conversion takes place. But an analog-digital convertor (ADC) can however also be connected to the output of the amplifier 63, that of the sample-and-hold device 65 or that of the multiplexer 66. Reference numeral 68 designates a controller, preferably a control processor, which governs and monitors the internal operations in the sensor system.

FIG. 6 accordingly shows, as an example, a design, in which the signals delivered by the sensor elements 10 pass through a signal processor 62 through 69. The signal processor 62 through 69 delivers—preferably serial—analog or digital data. The design according to FIG. 6 can be thereby hybrid or monolithic. With monolithic construction, signal processing is located on the same substrate 15 as the sensor elements 10. In the case of hybrid construction, the signal processor 62 through 69 is built up on its own substrate or chip and electrically connected to the sensor elements 10 on the substrate 15. But also in the case of this design, the two substrates are in immediate spatial proximity to one another and, in particular, inside a single housing (symbolized by reference numeral 69) which encloses the invented sensor system.

As already mentioned further above, a temperature sensor 64 can be provided for the absolute temperature of the substrate. With the aid of the same it is possible to relate the output signals of the sensor element 10, relative with regard to the substrate temperature, to the absolute temperature, so that a qualitative adjustment of the output signals of the sensor system will take place. With such a system it is possible, for example, to detect persons and to distinguish them from other sources of thermal radiation, provided the latter exhibit a temperature different from about 37° C. It is moreover possible to determine the temperature of objects with high accuracy, even when the temperature of the sensor itself is not constant.

The above-mentioned signal processor 62 through 69 can also exhibit a calibrating device, for example, in the form of fusible links, in order to set the characteristic curve of the sensor system or its sensor elements. Zero points and amplifications can be permanently set at the factory, for example, by burning through individual diode segments connected to calibrating resistors, so that any given sensor system will be compatible with another with regard to its characteristic curve. It is thus possible for the sensor system to be calibrated already during manufacture, so that the user will be able to replace it without recalibration. This makes servicing significantly easier.

Typical values for the invented sensor system are: The sensor elements are ordinarily rectangular and have edge lengths of between 40 and 500 μm. They are preferably square. The average distance of individual sensor elements from one another is between 50 μm and 1000 μm. A wafer employed as a substrate can have a thickness between 200 and 1000 μm, preferably between 300 and 500 μm. The depressions 35 preferably have a depth of more than 100 μm.

A small sensor system of this type can be used for various purposes. One field of application is the monitoring of vehicle interior spaces. The sensor system can be mounted on the roof of the vehicle and so configured with regard to its resolution (corresponding to the number of sensor elements 10) that it will be possible to tell whether individual seats in the vehicle are occupied. Other vehicle functions can be controlled according to the size of the signal thus obtained, for example, air conditioning, airbags, etc. Sensor systems according to the invention can also be used for monitoring buildings or, in general, for the detection of persons.

The described sensor system can be installed, with or without imaging optics and signal processing, in a small transistor housing with a volume of 1 cm$^3$ or less.

What is claimed is:

1. A sensor system for detecting thermal radiation comprising:
    a substrate,
    several sensor elements which deliver an electrical signal representative of the thermal radiation striking each, the several sensor elements attached to a substrate, and
    at least one self-test device for the generation of heat, whereby one or more sensor elements can be heated.

2. Sensor system according to claim 1, wherein several self-test devices are provided for the generation of heat, each assigned to a respective sensor element.

3. A sensor system according to claim 2, further comprising:
    a depression in the material of the substrate, beneath at least one sensor element, wherein
    the material depression is selected from one of a hole passing through the substrate and a recess set back from the front side of the substrate;
    an insulating layer on the surface of the substrate, to which sensor elements are attached;
    wherein the insulating layer spans the material depressions and the sensor elements are attached to the insulating layer in such a way that they lie entirely over, or in part over, the depressions in the material;
    an insulating device provided between sensor elements, said insulating device formed from a thermally conductive material upon the insulating layer with part of its area over the depression in the material and a slot in the insulating layer, in the vicinity of the depression in the material;
    wherein the self-test device is a device which generates a flow of heat, the self-test device has an elongated shape and is mounted in the vicinity of one edge of a sensor element.

4. The sensor system of claim 3 wherein the self-test device is mounted parallel to one edge of a sensor element.

5. Sensor system according to claim 1 wherein a depression in the material of the substrate is provided beneath at least one sensor element.

6. Sensor system according to claim 5, wherein the material depression is a hole passing through the substrate.

7. A sensor system according to claim 6 wherein the material depressions are the result of one of surface micromechanics process in porous silicon and reactive ion etching process.

8. Sensor system according to claim 5, wherein the material depression is a recess set back from the sensor side of the substrate.

9. Sensor system according to claim 5 including an insulating layer of the surface of the substrate, to which sensor elements aye attached.

10. Sensor system according to claim 9 wherein the insulating layer spans the material depressions and the sensor elements are attached to the insulating layer in such a way that they lie entirely over, or in part over, the depressions in the material.

11. Sensor system according to claim 9 further comprising an insulating device provided between sensor elements.

12. Sensor system according to claim 11 wherein the insulating device is formed from a thermally conductive material and attached upon the insulating layer with part of its area over the depression in the material.

13. Sensor system according to claim 11 wherein the insulating device is a slot in the insulating layer, in the vicinity of the depression in the material.

14. Sensor system according to claim 13, wherein a self-test device is provided between the slot provided as an insulating device and the sensor element.

15. Sensor system according to claim 1 wherein the self-test device is a device which generates a flow of heat, the self-test device has an elongated shape and is mounted in the vicinity of one edge of the sensor element.

16. The sensor system of claim 15 wherein the self-test device is mounted parallel to one edge of a sensor element.

17. A sensor system for the detection of thermal radiation, comprising:
    a substrate,
    several sensor elements in an array, each attached to the substrate and each of which generates an electrical signal representative of the thermal radiation striking it,
    several self-test devices, said self-test devices formed differently from one another in such a way that they respectively heat several sensor elements to respectively different levels, and a signal-processing device which converts at least the simultaneous electrical output signals of a set of sensor elements into a serial signal and delivers this as an output.

18. A process of self-testing a device in a sensor system for detecting thermal radiation wherein at least one self-test device is heated and an output system of at least one sensor element is monitored.

19. Process according to claim 18, wherein a self-test device is driven with a characteristic electric signal.

20. Process according to claim 19, wherein the electrical signal exhibits two or more pulses and/or a signal which changes over time.

21. Process according to claim 19 further comprising:
monitoring the sensor system during the self-testing process,
extracting an anticipated characteristic signal from the output signal of the sensor system, said anticipated characteristic signal being the response of the self-test device to said characteristic electrical signal, and
monitoring the remaining output signals.

22. A sensor system for the detection of thermal radiation, with a substrate, several sensor elements, each attached to the substrate and each of which generates an electrical signal representative of the thermal radiation striking it, characterized by a signal-processing device which converts at least the electrical output signals of sensor elements lying parallel to one another into a serial signal and delivers this to an output;
a calibrating device for permanently setting the characteristic curve of at least one sensor element; and
several self-test devices which are formed differently from one another in such a way that they heat several sensor elements to different levels wherein:
the signal-processing device is formed either on the substrate or on its own substrate, in the immediate vicinity of the substrates of the sensor elements and is electrically connected to the said sensor elements;
the sensor system comprises a device for the measurement of temperature, which delivers a signal representative of the absolute temperature.

23. A method of operating a sensor system utilizing at least one sensor element for the detection of thermal radiation comprising;
providing at least one self-test device between a slot provided as an insulating device and the sensor element;
heating that at least one self-test device;
monitoring the electrical signal from at least one sensor element;
driving a self-test device with a characteristic electric signal that exhibits two or more pulses and/or a signal which changes over time; and
continuing monitoring the sensor system during the self-testing process, removing an anticipated characteristic signal determined on the basis of the operation of the self-test device, in order to serve as a signal for monitoring.

24. Process for the production of a sensor system for detecting thermal radiation using sensor elements which deliver an electrical signal representative of the thermal radiation striking each and several self-test devices provided for the generation of heat, each assigned to a respective sensor element on a substrate comprising:
producing porous silicon using an electrochemical process on a front side of said substrate;
forming depressions in the porous silicon using surface-micromechanics; and
applying several sensor elements to the substrate disposed over said depressions.

25. Process for the production of a sensor system for detecting thermal radiation using sensor elements which deliver an electrical signal representative of the thermal radiation striking each sensor and several self-test devices provided for the generation of heat, each assigned to a respective sensor element on a substrate comprising:
forming depressions in the substrate using plasma-etching process during reactive ion etching on the back side of said substrate wherein a hole is formed with a depth of up to between 90 and 99% of the total depth by reactive ion etching and is generated to the final depth by isotropic or anisotropic etching; and
applying several sensor elements to the substrate disposed over said depressions.

* * * * *